(12) United States Patent
Lu

(10) Patent No.: US 11,232,838 B2
(45) Date of Patent: Jan. 25, 2022

(54) FERROELECTRIC FET-BASED CONTENT ADDRESSABLE MEMORY

(71) Applicant: Taiwan Semiconductor Manufacturing Company, Ltd., Hsinchu (TW)

(72) Inventor: Shih-Lien Linus Lu, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 17/102,762

(22) Filed: Nov. 24, 2020

(65) Prior Publication Data

US 2021/0233587 A1    Jul. 29, 2021

Related U.S. Application Data

(60) Provisional application No. 62/965,547, filed on Jan. 24, 2020.

(51) Int. Cl.
| | |
|---|---|
| *G11C 15/04* | (2006.01) |
| *H01L 27/1159* | (2017.01) |
| *G11C 7/10* | (2006.01) |
| *H01L 27/11592* | (2017.01) |

(52) U.S. Cl.
CPC ......... *G11C 15/046* (2013.01); *G11C 7/1069* (2013.01); *G11C 7/1096* (2013.01); *H01L 27/1159* (2013.01); *H01L 27/11592* (2013.01)

(58) Field of Classification Search
None
See application file for complete search history.

(56) References Cited

U.S. PATENT DOCUMENTS

| | | | |
|---|---|---|---|
| 10,916,287 B2 * | 2/2021 | Zhang | .............. H01L 29/78391 |
| 2018/0300626 A1 * | 10/2018 | Lee | ......................... G06N 3/049 |

FOREIGN PATENT DOCUMENTS

| | | |
|---|---|---|
| CN | 102820057 A | 12/2012 |
| TW | 201234532 A | 8/2012 |
| TW | 201833916 A | 9/2018 |
| TW | 201903765 A | 1/2019 |
| TW | 201905926 A | 2/2019 |
| TW | 201937486 A | 9/2019 |

(Continued)

OTHER PUBLICATIONS

Yin et al., "Exploiting ferroelectric FETs low-power non-volatile logic-in-memory circuits," Proceedings of the 35th International Conference on computer-Aided Design (ICCAD) 2016, pp. 8.

(Continued)

*Primary Examiner* — Tan T. Nguyen
(74) *Attorney, Agent, or Firm* — Merchant & Gould P.C.

(57) ABSTRACT

An efficient FeFET-based CAM is disclosed which is capable of performing normal read, write but has the ability to match input data with don't-care. More specifically, a Ferroelectric FET Based Ternary Content Addressable Memory is disclosed. The design in some examples utilizes two FeFETs and four MOSFETs per cell. The CAM can be written in columns through multi-phase writes. It can be used a normal memory with indexing read. It also has the ability for ternary content-based search. The don't-care values can be either the input or the stored data.

20 Claims, 16 Drawing Sheets

(56) References Cited

FOREIGN PATENT DOCUMENTS

| | | | |
|---|---|---|---|
| TW | 201946061 A | 12/2019 | |
| TW | 202004997 A | 1/2020 | |

OTHER PUBLICATIONS

Yin et al., "Design and bencmarking of ferroelectric FET based TCAM," Proceedings of Design Automation & Test in Europe Conference & Exhibit (DATE) 2017, pp. 1444-1449.

* cited by examiner

FERROELECTRIC FET-BASED CONTENT ADDRESSABLE MEMORY

CROSS-REFERENCE TO RELATED APPLICATIONS

The present application claims the benefit of U.S. Provisional Patent Application No. 62/965,547 titled "FERROELECTRIC FET-BASED CONTENT ADDRESSABLE MEMORY" and filed Jan. 24, 2020, the disclosure of which is hereby incorporated by reference in its entirety.

BACKGROUND

This disclosure relates generally to content-addressable memory ("CAM") devices. Content-addressable memory devices, including ternary CAM ("TCAM") devices, are used in a wide range of electronic devices, especially those used in high-speed searching application, such as routing in networking devices, due to hardware-implemented content matching.

CAM devices have certain advantages, such as high-speed searching capabilities, over certain other types of memory devices. However, traditional CAM devices also have certain drawbacks. For example, TCAM devices implemented by certain semiconductor devices, such as complementary metal-oxide-semiconductor ("CMOS") devices, require at least fourteen transistors per bit stored. Such implementations tend to lead to lower data density (bits per unit area) and high power consumption than many other types of memory devices. Efforts in developing CAM devices having improved characteristics are ongoing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
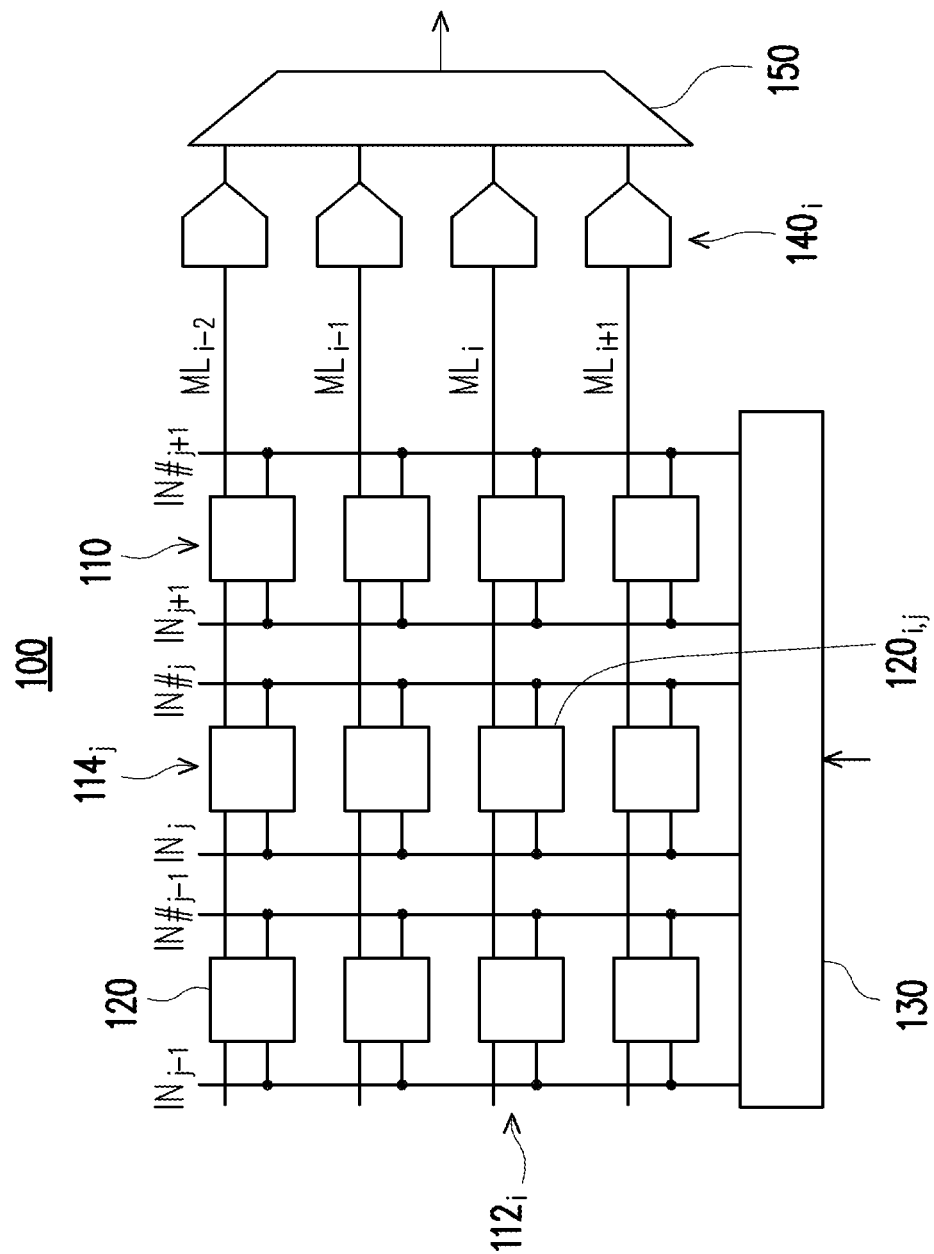
FIG. 1A is a schematic diagram illustrating an example ternary content-addressable memory (TCAM) device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure relates to content-addressable memory ("CAM") in general and ternary CAM ("TCAM") in particular. Generally, CAM enables access of data by the content stored in the memory instead of by the address (i.e., index) of the memory storing the data. CAM compares input search data with the data stored in a matrix of memory locations and returns the address of the memory storing data that match the searched data. CAM is capable of identifying matches in a single clock and is thus is a faster search system than many other search systems. CAMs can be used in a wide variety of applications requiring high search speeds. CAM is used extensively to classify and forward Internet protocol (IP) packets in network routers. In networks, such as the Internet, a message such an as e-mail or a Web page is transferred by first breaking up the message into small data packets and then sending each data packet individually through the network. These packets are routed from the source, through the intermediate nodes of the network (called routers) and reassembled at the destination to reproduce the original message. A router compares the destination address of a packet to all possible routes in order to choose the appropriate one. A CAM is particularly suited for implementing such lookup operation due to its fast search capability. CAM also finds applications in other areas, including parametric curve extraction, data compression, image processing and other a string matching or pattern matching applications, such as genome sequencing.

In certain applications, such as in network routing, packets with different addresses may be routed to the same port. For example, it can be the case where packets with addresses in a certain range are all to be routed to the same port. For example, packets with addresses in the range of 110100 through 110111 may be all routed to the same port. In such a case, the last two bits of the address becomes inconsequential for routing purposes. Thus, in some examples, ternary CAM, or TCAM, is used to store addresses to be matched to the addresses in the incoming packets. A TCAM stores one of three possible values: "0," "1," or "X", where "X" is a don't-care, which represents both "0" and "1," meaning that a stored "X" results in a match regardless of whether the incoming bit is a "0" or "1." Thus, for example, a stored "1101XX" would be a match to "110100," "110101," "110110" and "110111."

The high speed of CAM, including TCAM, often is achieved at the cost of complexity of the memory cells and corresponding high silicon area and high power consumption with conventional memory structures. For example, a TCAM cell implemented with complementary metal-oxide-semiconductor ("CMOS") can include fourteen or more transistors. Certain embodiments disclosed in the present disclosure utilize ferroelectric field-effect transistor (FeFET)-based memory elements to implement TCAMs, resulting in improved performance over the conventional TCAM devices in one or more regards, including speed, device complexity, devices density, and power consumption.

In accordance with some embodiments, a memory device includes one or more TCAM memory cells, each adapted to store, one at a time, at least three values, one of which indicative of a "0," one of "1" and one of "X" (don't-care). Each memory cell in some embodiments includes two data storage units, each adapted to store one binary bit ("0" or "1"). Each data storage unit includes a matchline ("ML") switching transistor; the ML switching transistors of the two data storage units form a serial combination with each other. As used in this disclosure, a "serial combination" of a transistor with another component means that the main current path (e.g., source-to-drain for a field-effect transistor, or emitter-to-collector for bipolar junction transistor). Each memory unit further includes a serial combination of an FeFET and an input switching transistor. One end (such as the drain or source of the FeFET) of the serial combination in one of the data storage units is connected to one end of the serial combination of the ML switching transistors; one end (such as the drain or source of the FeFET) of the serial combination in the other one of the data storage units is connected to the junction between the ML switching transistors.

The control terminals (base or gate) of the ML switching transistors can be connected to a common ML-Enable line ("$EN_{ML}$") to receive an ML-Enable signal. The gate of each of the FeFETs can be connected to a common wordline ("WL") to receive a WL signal to enable writing and reading of data to and from the FeFET. The junction between the serial combination of FeFET and input switching transistor can be connected to a selectline ("SL") to receive an SL signal to enable writing and reading of data to and from the FeFET. The drain or source of the FeFET connected to the respective ML switching transistor can be connected to a bitline ("BL") to receive a BL signal to enable the writing and reading of data to and from the FeFET. The control terminal (gate of base) of each input switching transistor can be connected to an inputline ("IN") to receive an input value to be matched with the value stored in the FeFET.

In some embodiments, a TCAM array includes TCAM cells described above and arranged in columns and rows. The ML switching transistors of each row of the TCAM cells are connected in series and share a common ML-Enable line and a common WL. The TCAM cells in each column share a common BL, SL and IN. In some embodiments, the TCAM cells can be used for data storage and retrieval by conventional means, as well as for content-based searching. In certain of such embodiments, each TCAM cell is adapted to store two bits of data. In some embodiments, the data storages cells in a TCAM array are configured to be written to column-by-column and read from row-by-row.

In some embodiments, a method of data processing includes storing in a memory array a set of values, each of which being indicative of a binary "0," "1" or "X" (don't-care), the stored values thereby representing a first binary pattern. The method further includes providing a second set of values, each corresponding to a respective one of the first set of values and being indicative of a binary "0," "1" or "X," the second set of values thereby representing a second binary pattern. At least one of the first and second set of values includes a value indicative of a binary "X." The method further includes comparing each of the first set of values with the corresponding one of the second set of values, and generating a signal indicative of a match between the first and second binary patterns if each value in the first set and the corresponding value in the second set are identical to each other, or at least one of the two values is indicative of an "X." In some embodiments, at least one of the first set of values is indicative of an "X;" in some embodiments, at least one of the second set of values is indicative of an "X."

In certain more detailed embodiments, as shown in FIG. 1A, a data processing device 100, for example a TCAM, includes an array 110 of TCAM cells 120 (each cell labeled $120_{i,j}$), arranged in rows 112 (the ith row labeled as $112_i$) and columns 114 (the jth column labeled as $112_j$). The arrangement of the TCAM cells 120 in rows and columns is a logical one but can be a physical one as well. Each TCAM cell 120 is adapted to store a value, such as a pair of binary bits, that is indicative of a "0," "1" or "X." The stored values in the TCAM cells 120 in each row 112 represents a pattern against which an input pattern is to be compared, as explained in more details below. In some embodiments, the TCAM cells are as described in further detail below in connection with FIGS. 1B-1H and 2. The TCAM cells 120 in each column 114 are connected to a common pair of inputlines IN and IN # (the IN and IN # lines connected to the TCAM cells in the jth column labeled as $IN_j$ and IN $\#_j$, respectively). The inputlines are connected to a search data input interface 130, which in some embodiments is a register or driver supplying the pattern to be searched, the pattern including, for example, values, each indicative of a "0," "1" or "X." The TCAM cells 120 in each row 112 are connected in series, forming a matchline ML (the ML for the ith row labeled as $ML_i$). Each ML is adapted to receive an ML input signal at one end and output at the other end an ML output signal into an amplifier 140 (the amplifier for the ith row labeled as $140_i$). As explained in more details below, the ML for each row 112 outputs (e.g., to the respective amplifier 140) a signal (e.g., a binary "1") indicative of a match between the pattern to be searched supplied at the inputlines and the pattern stored in the corresponding row of TCAM cells. A "match" in such embodiments is indicated on the ML if each value in the pattern to be matched and the corresponding value in the stored pattern are identical to each other, or at least one of the two values is indicative of an "X." The amplifiers 140 in some embodiments are connected to a match output interface 150, which in some embodiments includes a mapping device, such as an encoder, which outputs a destination designator, such as a port number, for each ML that indicates a "match."

Figure 3:
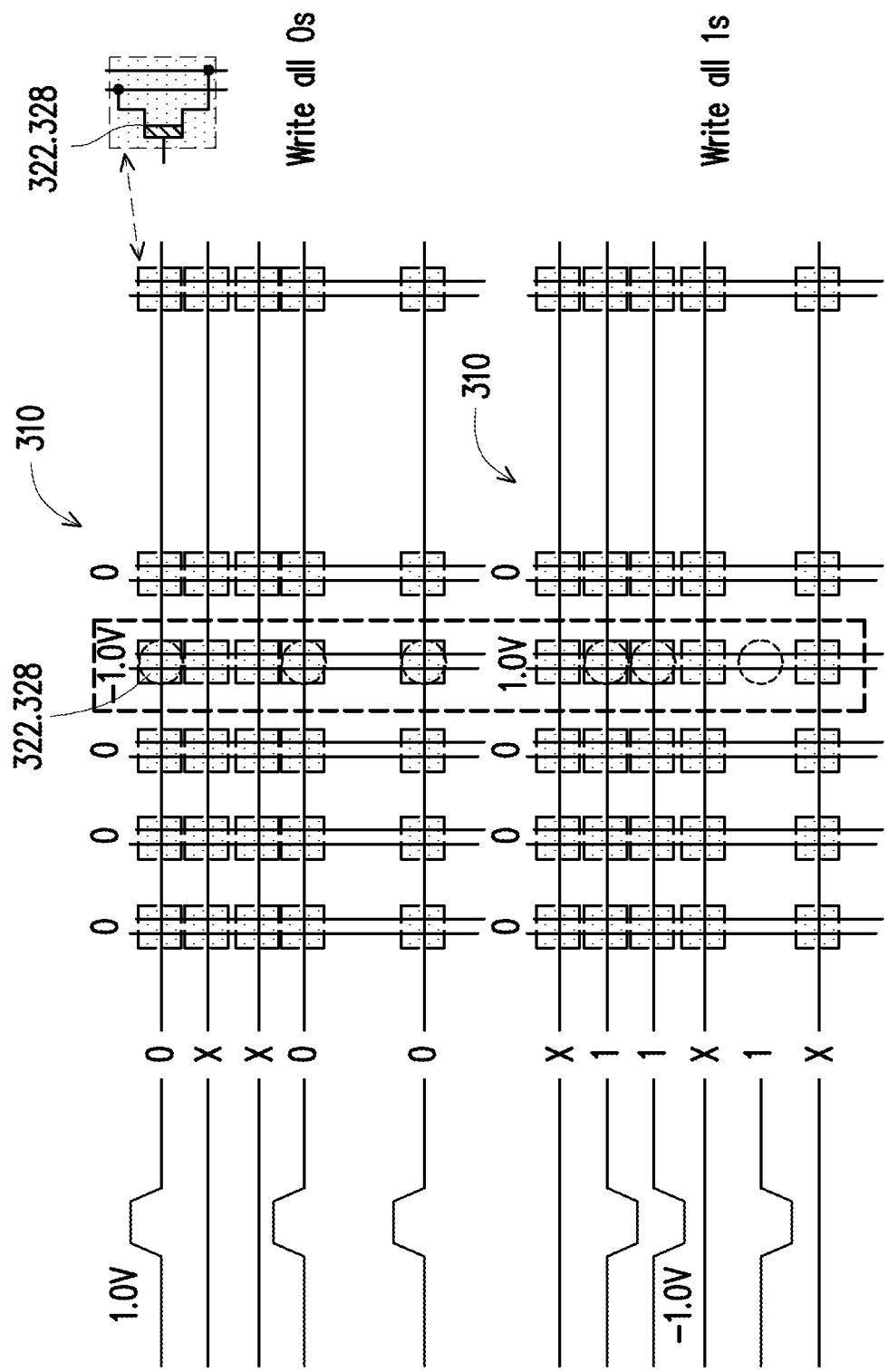
FIG. 3 illustrates a phased writing to the memory elements in a TCAM device of the type shown in FIG. 2, in accordance with some embodiments.

In some embodiments, as described in more details below in connection with FIG. 3, the TCAM cells 120 in each row 112 are connected to a common wordline WL (not shown in FIG. 1; shown in FIG. 3; the WL for the ith row labeled as $WL_i$). The TCAM cells 120 in each column 114 are connected to a common pair of bitlines BL and BL # (the BL and BL # lines connected to the TCAM cells in the jth column labeled as $BL_j$ and BL $\#_j$, respectively). The TCAM cells 120 in each column 114 are connected to a common pair of selectlines SL and SL # (the SL and SL # lines connected to the TCAM cells in the jth column labeled as $SL_j$ and SL $\#_j$, respectively). In some embodiments, as described in more details below, combinations of signals at the WL, BL, BL #, SL, SL #, IN and IN # for each TCAM cell 120 enables writing values to the TCAM cell 120 and reading the stored value from the TCAM cell 120.

Figure 1C:
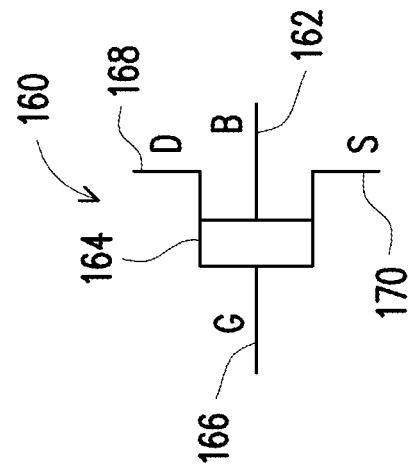
FIGS. 1B and 1C are, respectively, a schematic structure and symbolic representation of a ferroelectric field-effect transistor (FeFET) of the kind used in the TCAM device illustrated in FIG. 1A, in accordance with some embodiments.
Figure 1B:
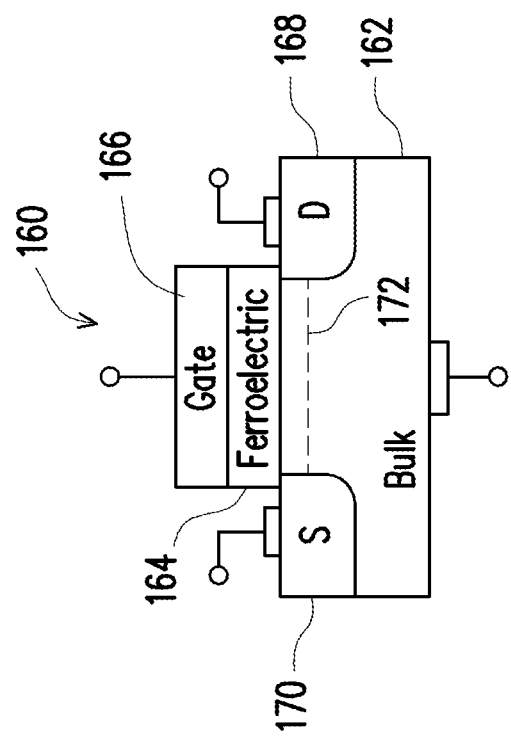

Referring further to FIGS. 1B and 1C, FeFETs 160 are used in TCAM cells in some embodiment. Each FeFET 160 includes a bulk substrate 162 and heavily doped source 170 and drain 168 separated by the bulk 162, which is doped in the region between the source 170 and drain 168, thereby form a channel region 172 therebetween. The FeFET further includes a ferroelectric layer 164 covering the region of the channel region 172 separating the source 170 and drain 168. The FeFET further include a gate 166 covering the ferroelectric layer 164.

Figures 1D, 1E, 1F:
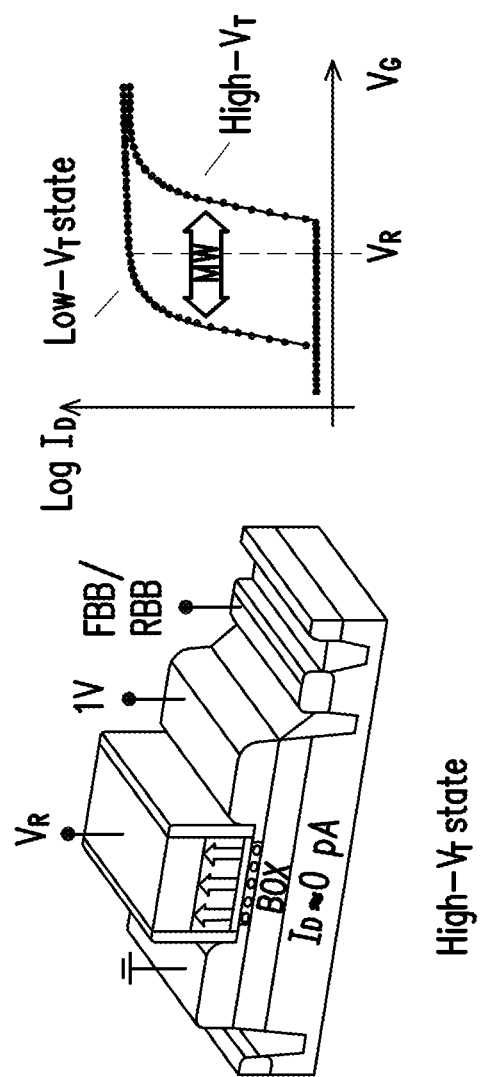
FIGS. 1D, 1E and 1F are, respectively, a schematic diagram of an FeFET in a low-resistance state, a schematic diagram of an FeFET in a high-resistance state, and a drain current-vs.-gate voltage plot exhibiting hysteresis characteristics for an FeFET, in accordance with some embodiments.

As illustrated in FIGS. 1D-1F, when the gate 166 is biased (with a voltage $V_G$) relative to the source 170 and drain 168 such that the ferroelectric layer is polarized in a given direction (in this example from the gate toward the bulk), the channel region become low-resistance, corresponding to one memory state (e.g., "1"), and a drain current ($I_D$) from the source to drain is permitted to flow under the source-to-drain bias (1V in this example); in contrast, when the gate 166 is biased relative to the source 170 and drain 168 such that the ferroelectric layer is polarized in the opposite direction (in this example toward the gate from the bulk), the channel region become high-resistance, corresponding to a different memory state (e.g., "0"), and a drain current ($I_D$) from the source to drain is not permitted to flow (or only a small current flows) under the source-to-drain bias (1V in this example). As indicated in FIG. 1F, the $V_G$-$I_D$ plot exhibits a hysteresis, where $V_G$ must exceed a threshold voltage ($V_T$) in opposite direction to the polarization direction to reverse the polarization of the ferroelectric layer 164. Thus, the magnitude of the difference in $V_T$ between the two states constitutes a memory window ("MV") and the magnitude of the gate-to-source voltage $V_{GS}$ must exceed the MW to switch between the memory states.

Figure 1G:
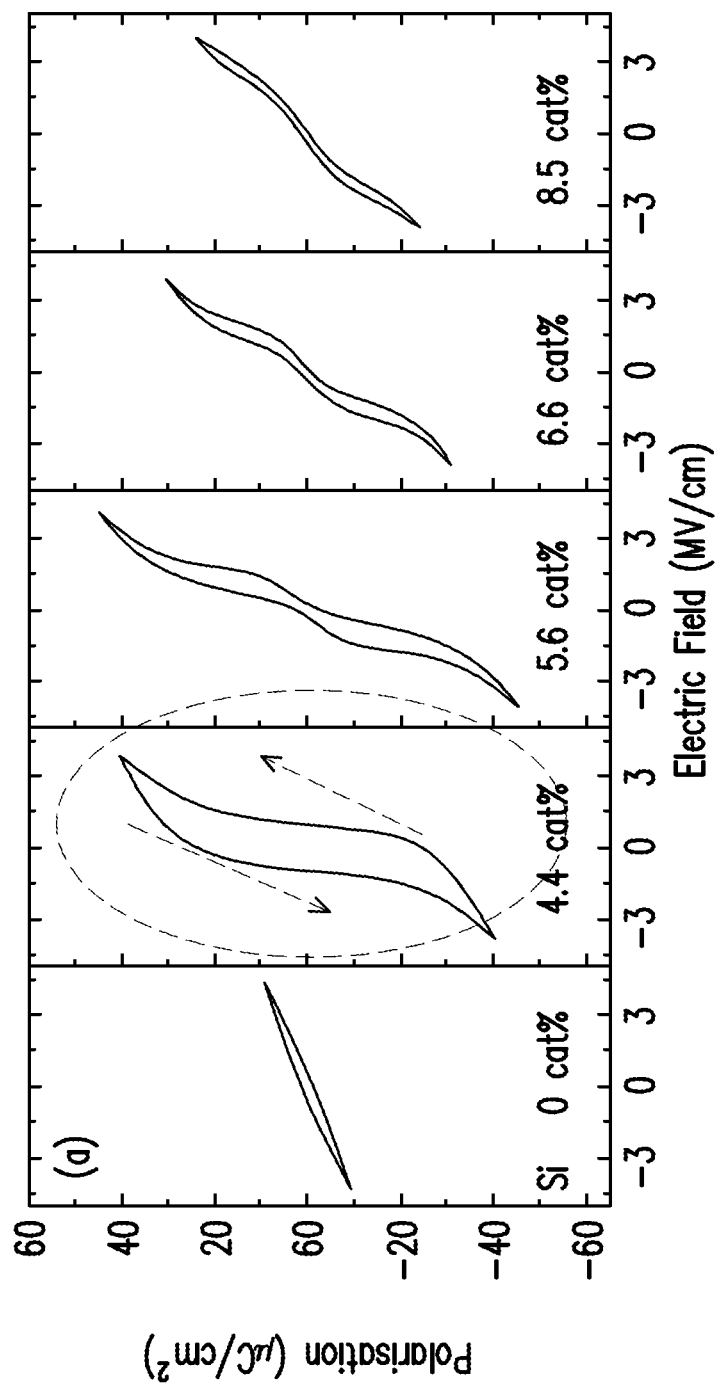
FIG. 1G shows plots of polarization vs. electric field for $Si:HfO_2$ for varying Si cation mole fractions (cat %). Ferroelectric property is evident at about 4.4 cat %, in accordance with some embodiments.

FeFETs can be made using various ferroelectric materials for the ferroelectric layer. Examples of suitable ferroelectric materials include hafnium oxide and hafnium zirconium oxide. For example, hafnium oxide with silicon cations (Si:HfO$_2$) can be used. FIG. 1G shows plots of polarization vs. electric field for Si:HfO$_2$ for varying Si cation mole fractions (cat %). As polarization is correlated to conductivity, and electric field is correlated to voltage, a hysteresis loop in a plot of polarization vs. electric field demonstrates ferroelectric property. As shown in FIG. 1G, hysteresis is present for a range of compositions but is the most pronounced at about 4.4 cat %. Hafnium oxide with substantially this composition can thus be used. Other ferroelectric materials can be used as well.

Figure 1H:
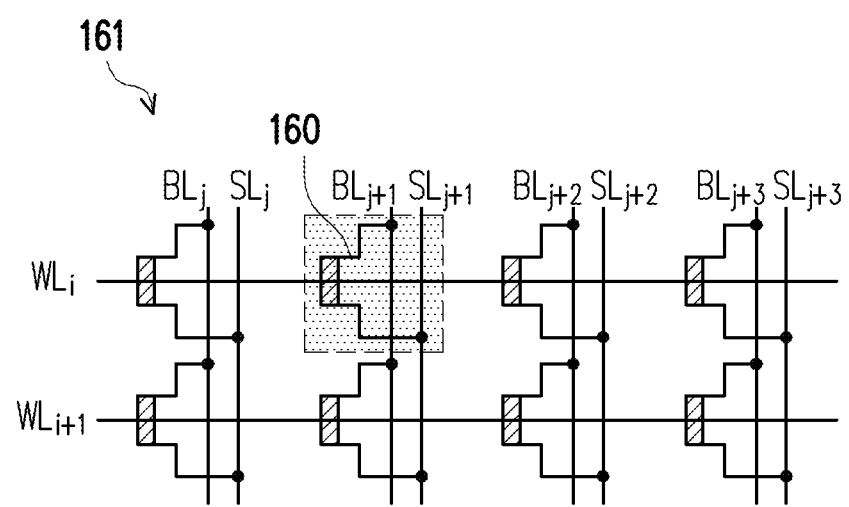
FIG. 1H shows schematically a two-dimensional array of FeFET memory cells, in accordance with some embodiments.

According to some embodiments, an array of TCAM cells, in additional to being capable of being configured to perform content-based search operations, can be configured to function as a conventional FeFET memory array. In some embodiments, such as shown in FIG. 1H (in which BL #, SL # and IN # are omitted for simplicity and clarity of illustration), when IN's and ML's (not shown for simplicity) are all turned off, a TCAM array becomes a FeFET memory array 161, with WL's, BL's and SL's biased for writing to, and reading from, the FeFET cells 160. Specifically, to write data to the FeFETs, WL (gate) is biased relative to BL/SL (drain/source). For example, to write a "0," a positive pulse can be applied to WL, and negative pulse applied to BL/SL; to write a "1," a negative pulse can be applied to WL, and positive pulse applied to BL/SL. In some embodiments, data are written column-by-column, by, for example, writing all "0"s simultaneously and the all "1"s simultaneously (or reverse the order), as described in more details below. To read from the FeFETs, BL can be precharged to a voltage $V_R$, with SL connected to ground. A pulse of $V_R$ is applied to the WL for a row while the WLs for the remaining rows are set at ground, and the voltages on the BLs for the row are indicative of the values stored in the row. In some embodiments, the TCAM device 300 also include a stored data input/output ("I/O") interface (not shown), which in some examples include drivers for applying WL signals for writing data to the FeFETs, and sense amplifiers connected to the BLs for reading data stored in the FeFETs.

Figure 2:
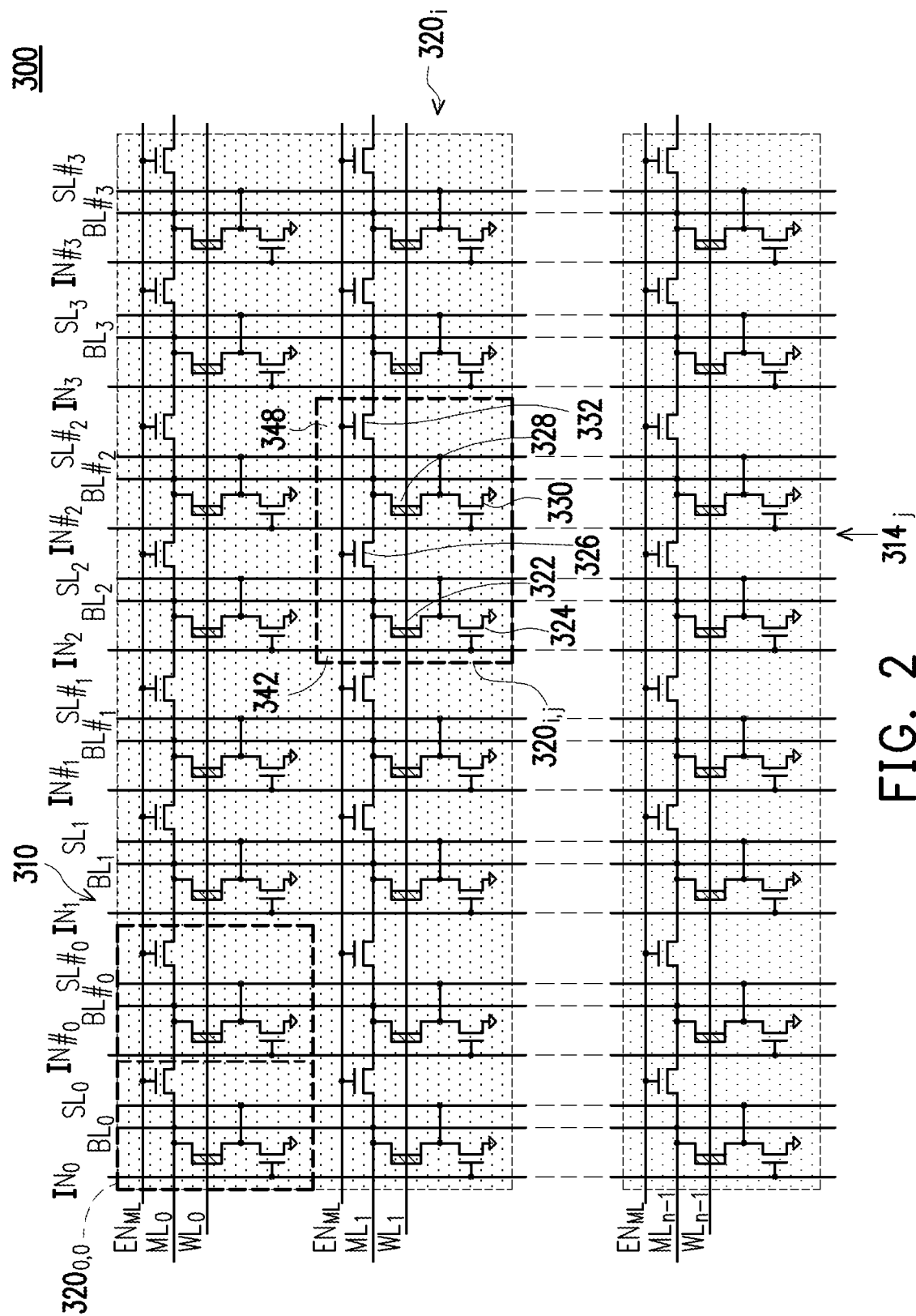
FIG. 2 schematically shows a ternary content-addressable memory (TCAM) device in accordance with some embodiments.

More specifically, according to some embodiments, as shown in FIG. 2, a TCAM device 300 includes a two-dimensional array 310 of TCAM cells 320 (each cell labeled 320$_{i,j}$ arranged in rows 312 (the ith row labeled as 312$_i$) and columns 314 (the jth column labeled as 312). Each TCAM cell 320 includes two data storage units 342, 348, each adapted to store one binary bit ("0" or "1"). Each data storage unit includes a matchline ("ML") switching transistor 326, 332 (an FET in this example); the ML switching transistors of the two data storage units form a serial combination with each other. Each memory unit 342, 348 further includes a serial combination of an FeFET 322, 328 and an input switching transistor 324, 330. In some embodiments, the drain or source of the FeFET of the serial combination in one of the data storage units is connected to one end of the serial combination of the ML switching transistors; the drain or source of the FeFET of the serial combination in the other one of the data storage units is connected to the junction between the ML switching transistors. In the example embodiment shown in FIG. 2, the source of the FeFET 322, 328 is connected to the drain of the input switching transistor (an FET in this example) 324, 330, and the drain of the FeFET 322, 328 is connected to the ML switching transistor 326, 332. The source of the input switching transistor (an FET) 324, 330 in some embodiments is connected to a voltage reference point, such as ground in this example.

The control terminals (base or gate) of the ML switching transistors 326, 332 in this embodiment are connected to a common ML-Enable line ("EN$_{ML}$") to receive an ML- Enable signal. The gate of each of the FeFETs 322, 328 is connected to a common wordline ("WL") to receive a WL signal to enable writing and reading of data to and from the FeFET 322, 328. The junction between the serial combination of FeFET 322, 328 and input switching transistor 324, 330 is connected to a selectline ("SL" or "SL #") to receive an SL signal to enable writing and reading of data to and from the FeFET. The drain or source of the FeFET 322, 328 connected to the respective ML switching transistor 326, 332 is connected to a bitline ("BL" or "BL #") to enable the writing and reading of data to and from the FeFET 322, 328. The control terminal (gate of base) of each input switching transistor 324, 330 is connected to an inputline ("IN" or "IN #") to receive an input value to be matched with the value stored in the FeFET 322, 328.

In some embodiments, a TCAM array 310 includes TCAM cells 320 described above and arranged in columns 314 and rows 312. The ML switching transistors 342, 348 of each row of the TCAM cells 342, 348 are connected in series and share a common ML-Enable line and a common WL for the row. The TCAM cells in each column share a common BL, BL #, SL, SL #, IN and IN #. In some embodiments, the TCAM cells can be used for data storage and retrieval by conventional means, as well as for content-based searching. For example, with $EN_{ML}$ all off and IN's and IN #'s all off, the device 300 become the same as the example circuit 170 shown in FIG. 1H and functions as an FeFET memory array.

In the example shown in FIG. 2, each TCAM cell 320 is adapted to store a pair of bits of data, one stored in the FeFET 322, the other stored in the FeFET 328. The pair of bits stored in each TCAM cell 320 is indicative of a "0," "1" or "X." In certain examples below, each pair is denoted as "($b_1$, $b_2$)," with each of $b_1$ and $b_2$ can be "0" or "1." For example, in some embodiments, a (0, 1) stored in a TCAM cell 320 is indicative of a binary "0;" a (1, 0) indicative of a binary "0;" and a (0, 0) indicative of an "X."

In some embodiments, digital patterns representing binary strings are stored in TCAM cells 320, each pattern stored in a row 312. An input digital pattern is compared with the stored digital patterns, and the row(s) storing the matching pattern(s) (don't-cares count as matches) are signaled by, for example, a "1" on the respective MLs. In some embodiments, the TCAM cells 320 are written to column-by-column. In some embodiments, columns of data storage units 342, 348 are written one column at a time. In some embodiments, such as the example illustrated in FIG. 3, each column of FeFET's can be written to in two phases, with all "0"s written in one phase and all "1"s written in the other phase. Writing "0"s involves applying positive pulses (e.g., 1.0 V) to the WLs in all rows in which "0"s are to be written and applying negative pulses (e.g., −1.0 V) to the BL and SL, or BL # and SL # of the column to be written. Writing "1"s involves applying negative pulses (e.g., −1.0 V) to the WLs in all rows in which "1"s are to be written and applying positive pulses (e.g., 1.0 V) to the BL and SL, or BL # and SL # of the column to be written. In the example showing in FIG. 3, "0" are written first, but the reverse order can be used as well.

As a specific example, shown in FIGS. 4-7, to write a column 314 TCAM cells, all the "0"s are written to the appropriate FeFETs 322 (associated with BL, SL and IN) in the column. Next, all the "0"s are written to the appropriate FeFETs 328 (associated with BL #, SL # and IN #) in the column. Next, all the "1"s are written to the remaining FeFETs 322 in the column. Next, all the "1"s are written to the remaining FeFETs 328 in the column. More specifically, in writing operations, 0 V is applied to all IN and IN # lines, turning off all input switching transistors 324, 330, and 0 V is applied to all $EN_{ML}$ lines, turning off all ML switching transistors. The TCAM device is thus configured as a FeFET memory array similar to the one shown in FIG. 1H.

Figure 4:
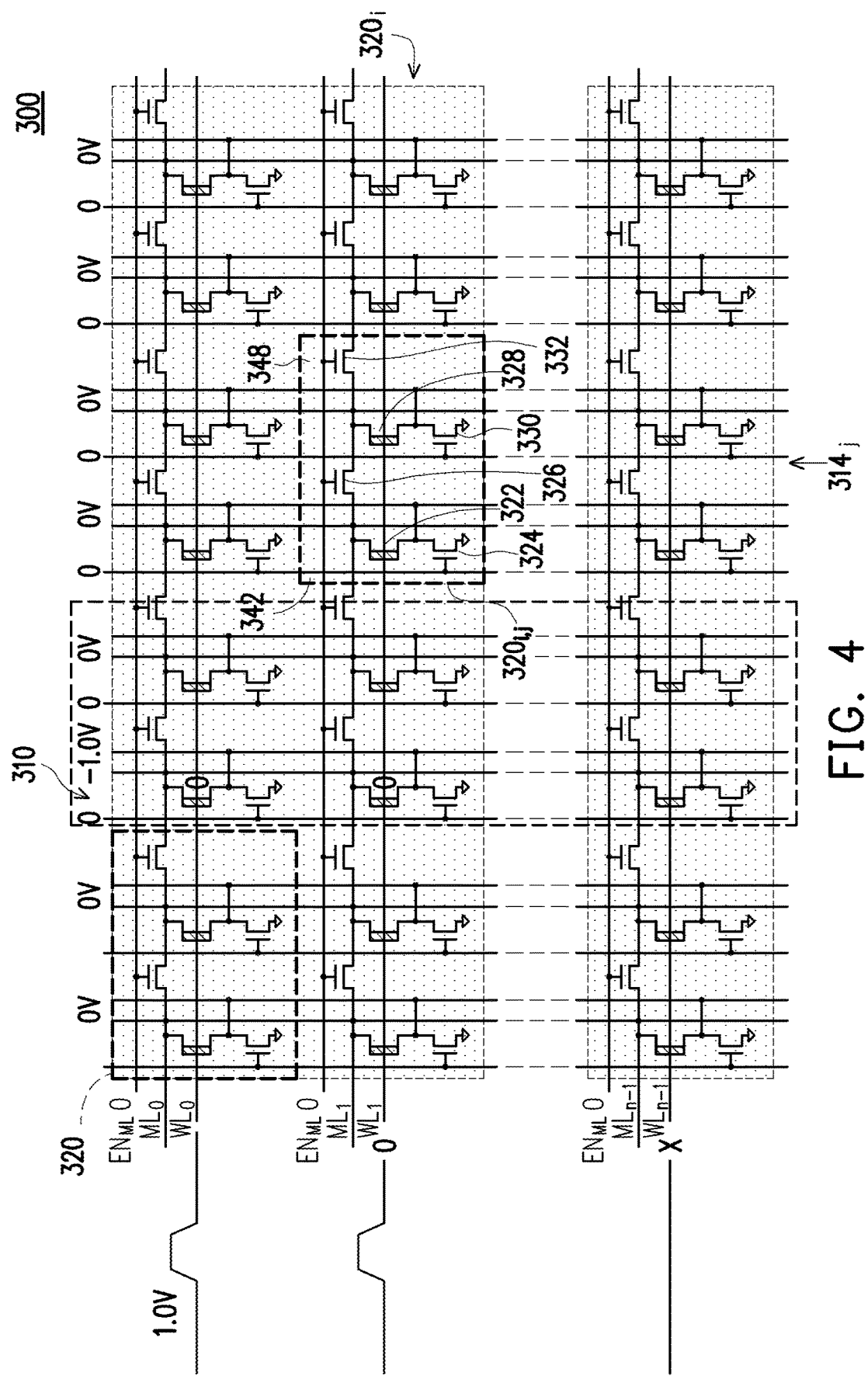
FIG. 4 illustrates writing 0's to the Data bits of certain TCAM cells in a column of a TCAM array in accordance with some embodiments.
Figure 5:
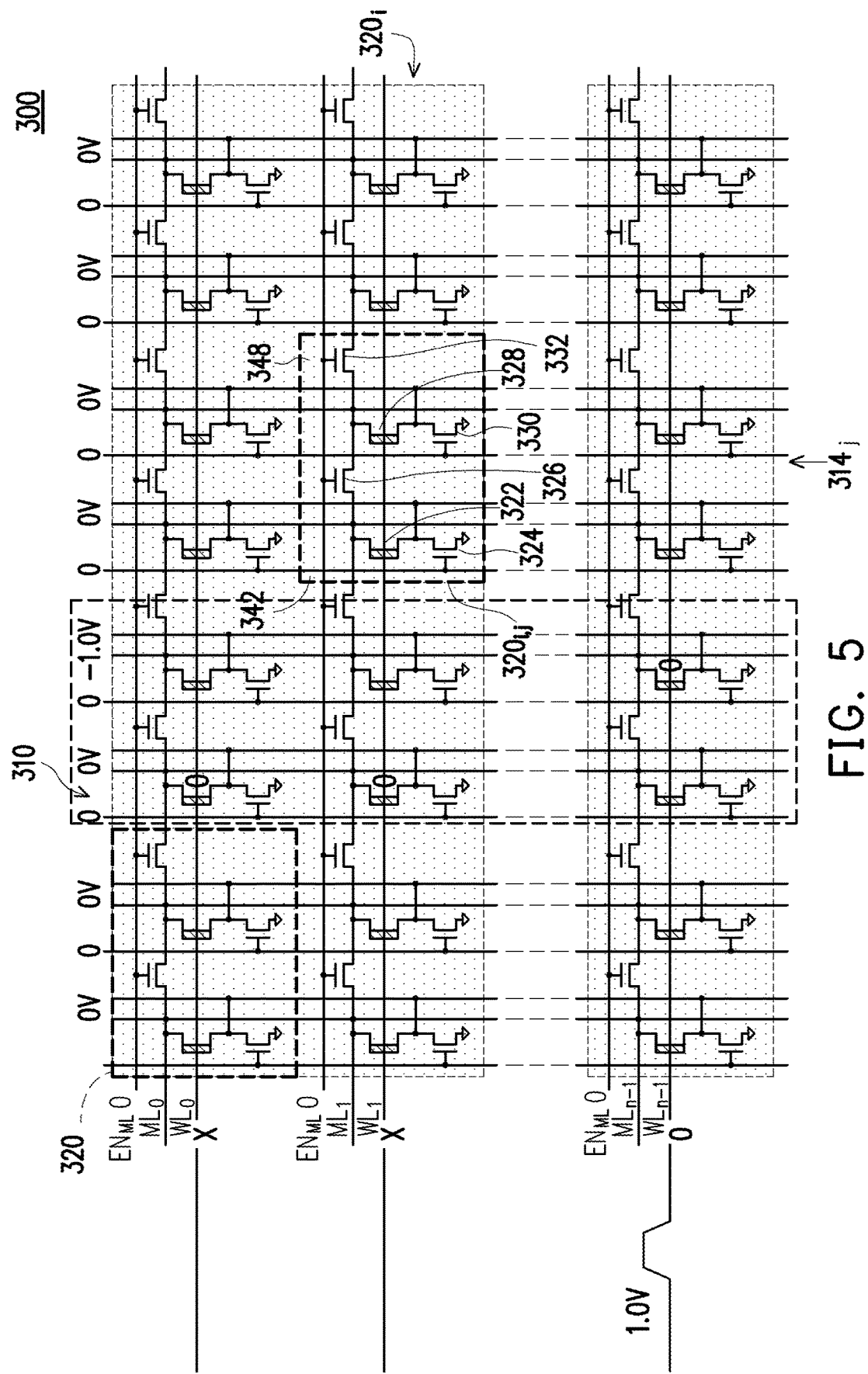
FIG. 5 illustrates writing 0's to the Data-complement (Data #) bits of certain TCAM cells in a column of a TCAM array in accordance with some embodiments.

To write "0"s to FeFETs 322, as shown in FIG. 4, a positive pulse is applied to the WLs of the rows to which "0" are to be written, and the BL and SL of the column to be written are biased at a negative voltage. The BLs and SLs of the remaining columns, and all BL #s and SL #s are bias at 0 V. To write "0"s to FeFETs 328, as shown in FIG. 5, a positive pulse is applied to the WLs of the rows to which "0" are to be written, and the BL # and SL # of the column to be written are biased at a negative voltage. The BL #s and SL #s of the remaining columns, and all BLs and SLs are bias at 0 V.

Figure 6:
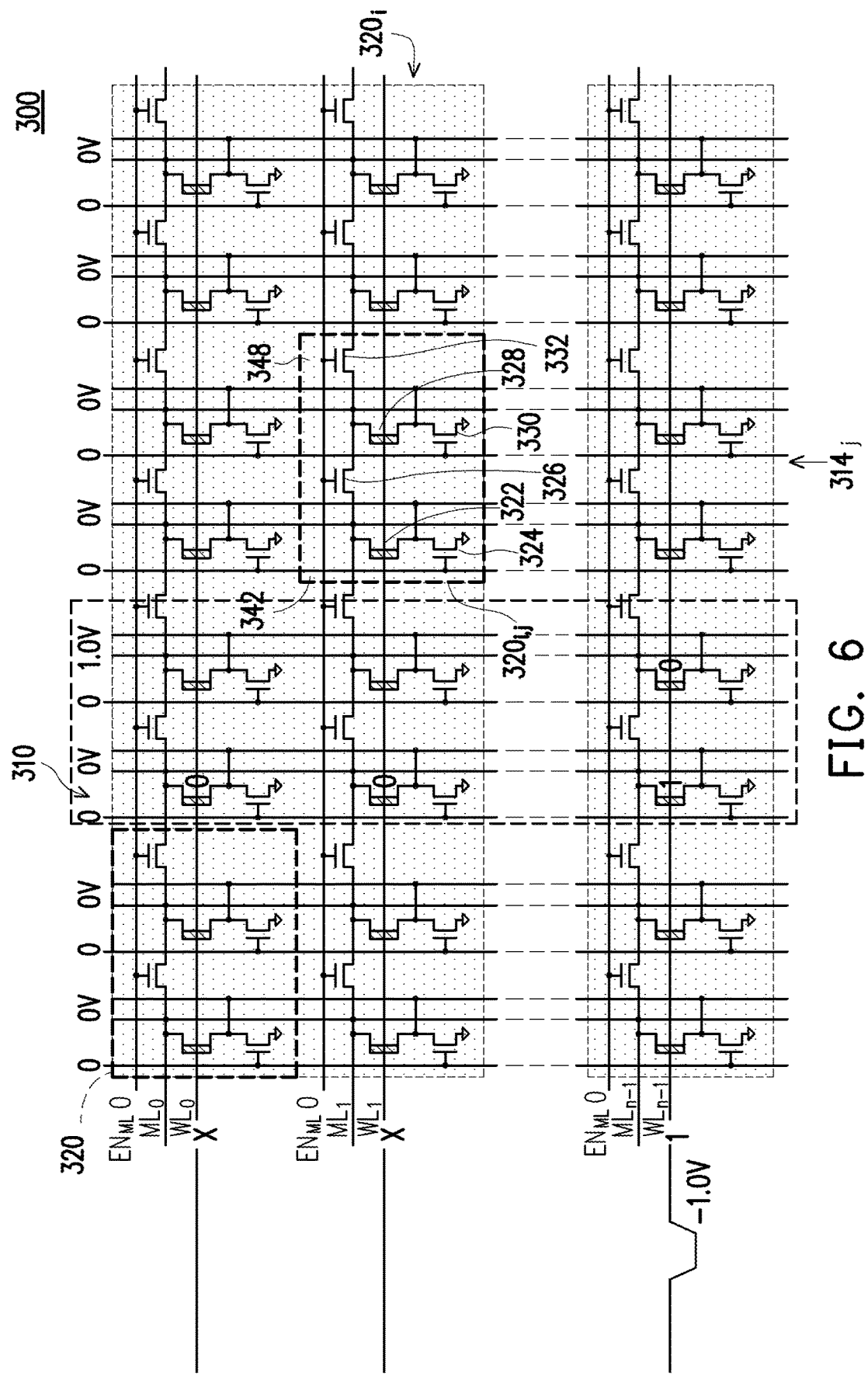
FIG. 6 illustrates writing 1's to the Data bits of certain TCAM cells in a column of a TCAM array in accordance with some embodiments.
Figure 7:
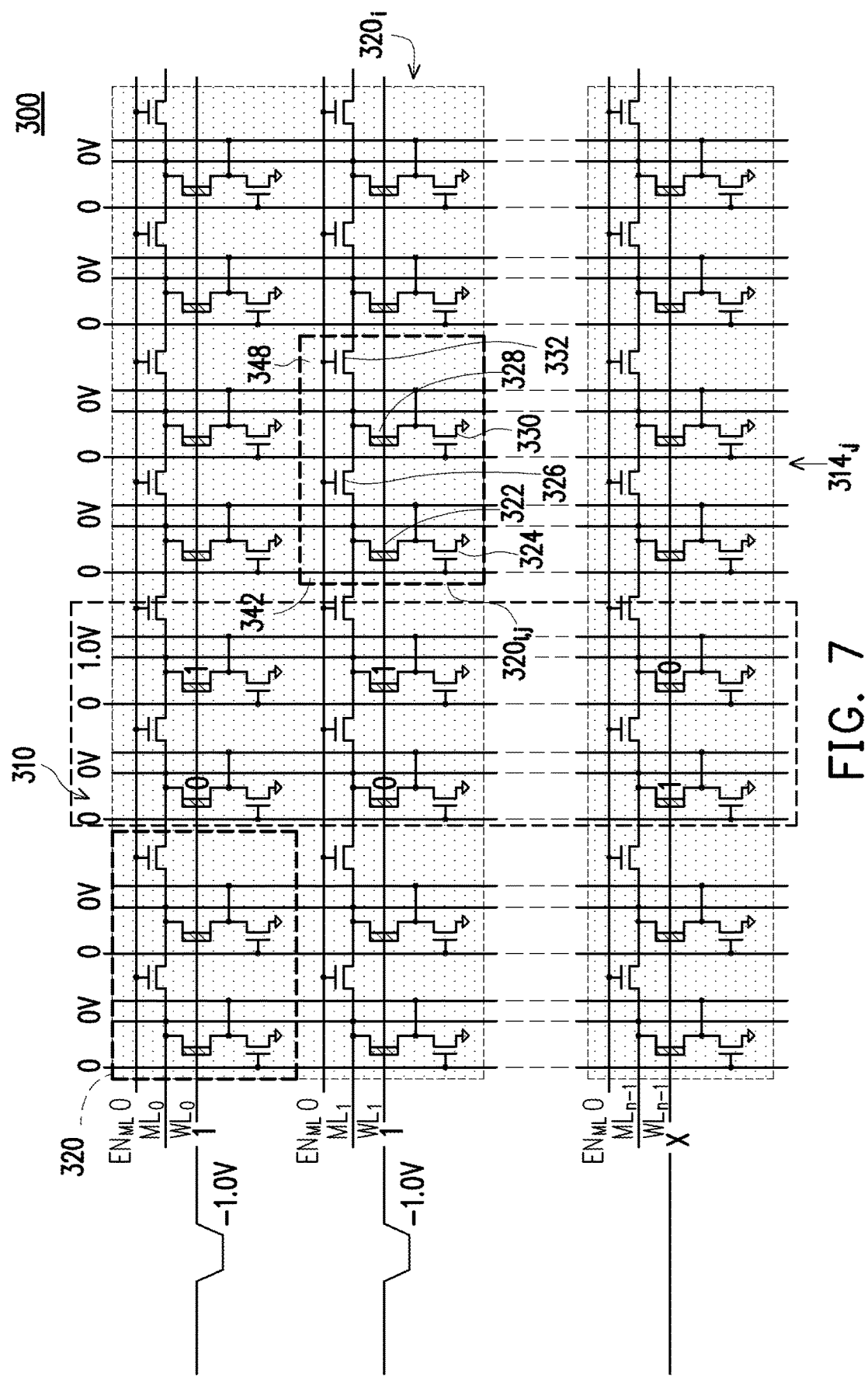
FIG. 7 illustrates writing 1's to the Data-complement (Data #) bits of certain TCAM cells in a column of a TCAM array in accordance with some embodiments.

To write "1"s to FeFETs 322, as shown in FIG. 6, a negative pulse is applied to the WLs of the rows to which "1" are to be written, and the BL and SL of the column to be written are biased at a positive voltage. The BLs and SLs of the remaining columns, and all BL #s and SL #s are bias at 0 V. To write "1"s to FeFETs 328, as shown in FIG. 7, a negative pulse is applied to the WLs of the rows to which "1" are to be written, and the BL # and SL # of the column to be written are biased at a positive voltage. The BL #s and SL #s of the remaining columns, and all BLs and SLs are bias at 0 V.

Figure 8:
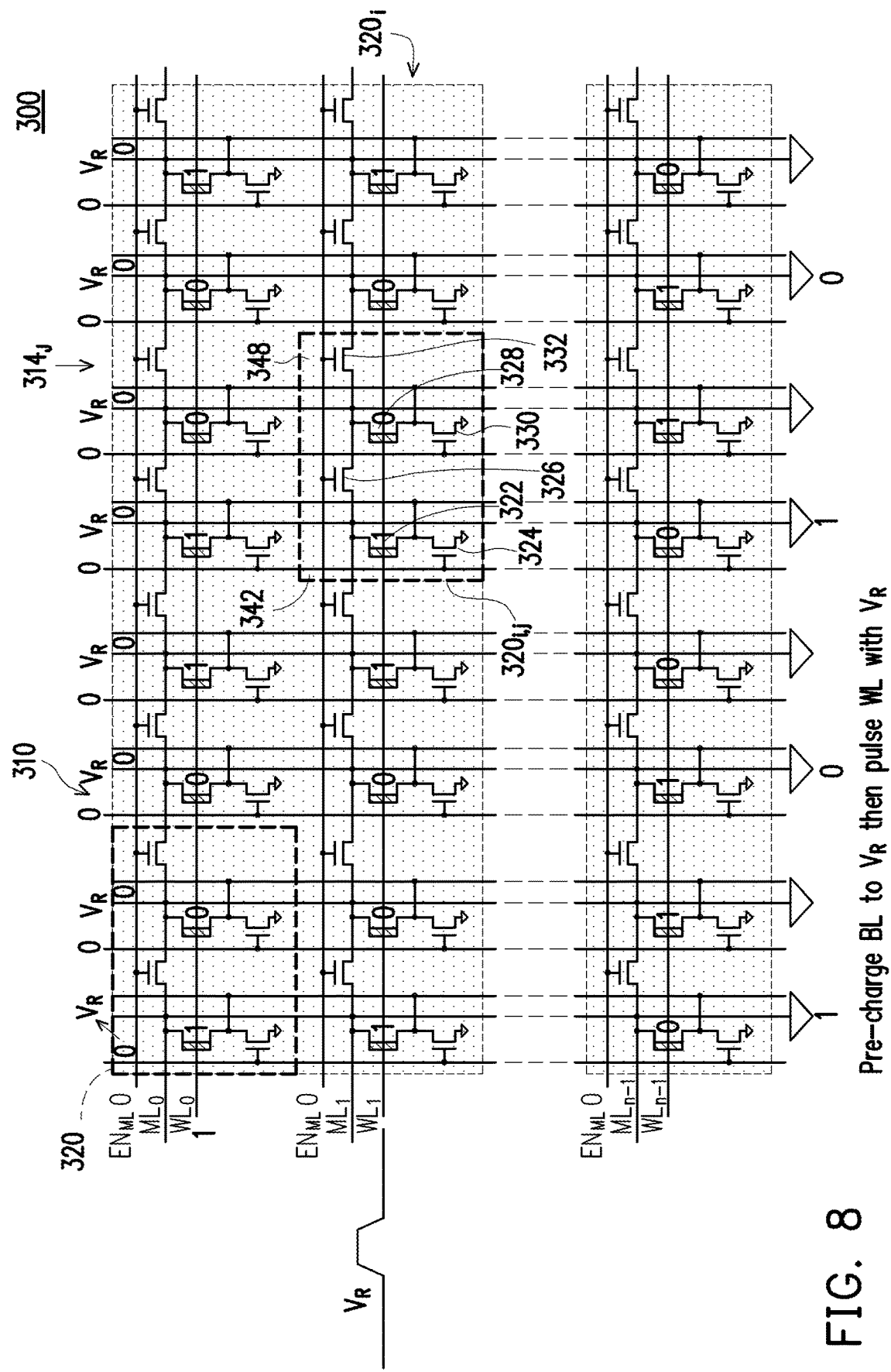
FIG. 8 illustrates reading from a row of memory cells in accordance with some embodiments.

In some embodiments, the data stored in the TCAM cells are read row-by-row. When reading data, 0 V is applied to all IN and IN # lines, turning off all input switching transistors 324, 330, and 0 V is applied to all $EN_{ML}$ lines, turning off all ML switching transistors. The TCAM device is thus configured as a FeFET memory array similar to the one shown in FIG. 1H. To read a row of data, as shown in FIG. 8, all BLs and BL #s are precharged to a positive read voltage $V_R$ ($|V_R|<|V_T|$), and all SLs and SL #s are set at 0 V. A read voltage $V_R$ pulse is then applied to the WL of the row to be read. For an FeFET 322, 328 storing a "1," the drain-to-source (BL-to-SL or BL #-to-SL #) resistance is high, and the rate of discharge from the respective BL or BL # would therefore be very small, in some examples near zero, and voltage drop on the BL or BL # would be very small, in some examples near zero, during the period when the read voltage $V_R$ pulse is applied to the WL. In contrast, for an FeFET 322, 328 storing a "0," the drain-to-source (BL-to-SL or BL #-to-SL #) resistance is low, and the rate of discharge from the respective BL or BL # would therefore be fast, and voltage drop on the BL or BL # would be significant during the period when the read voltage $V_R$ pulse is applied to the WL. The voltage on the BL or BL # at the end of the read voltage $V_R$ pulse is thus indicative of the value stored in the respective FeFET and can be converted to a binary value indicative of the stored value using, for example an analog-to-digital converter ("DAC") (not shown).

Figure 9:
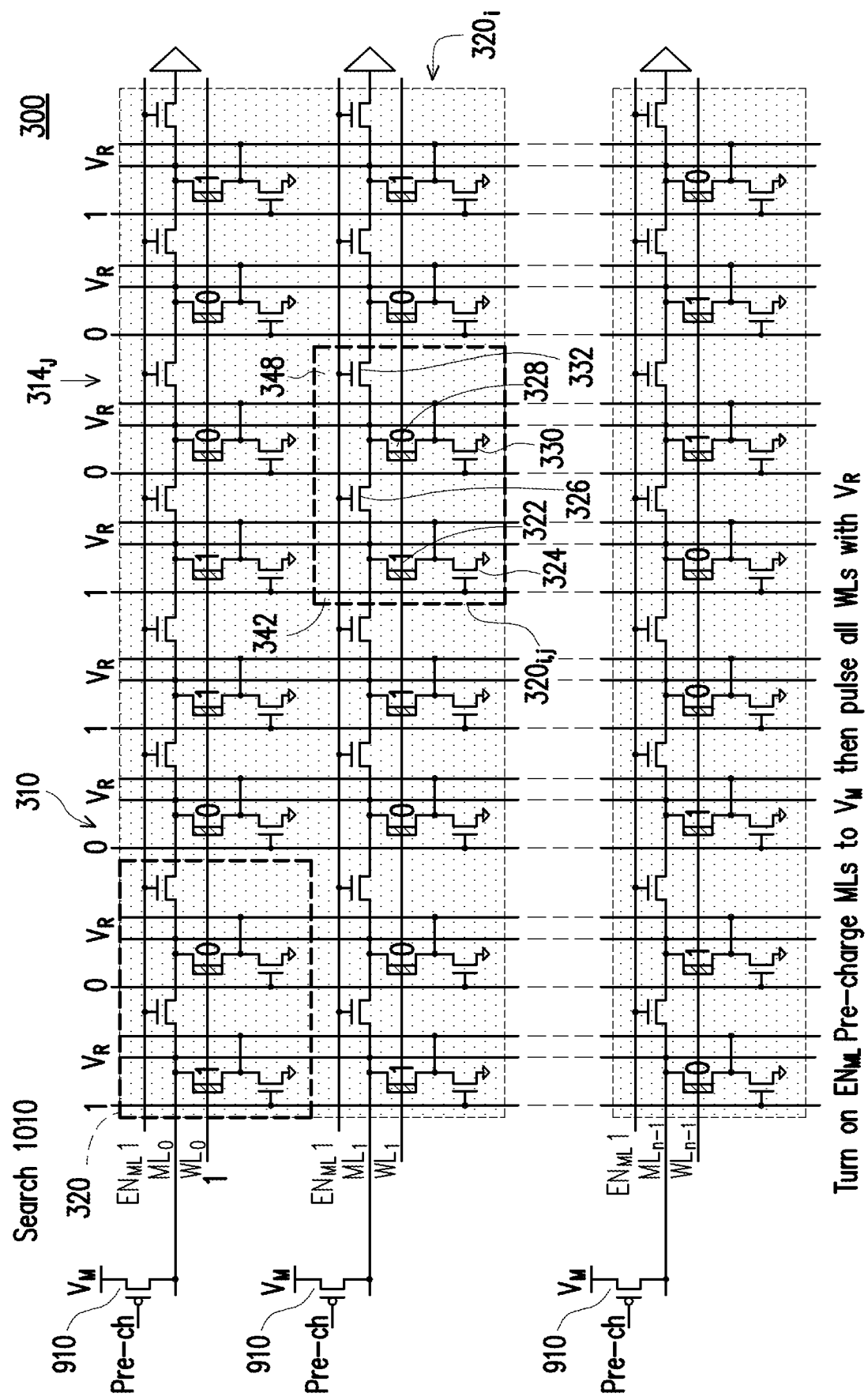
FIG. 9 illustrates a search operation, wherein a specific bit pattern is searched against specific bit patterns, in accordance with some embodiments.

In some embodiments, as shown in FIG. 9, to determine if an input pattern matches any of the patterns stored in the TCAM array 310, the input pattern is applied to the IN and IN # lines; the matchlines MLs are precharged to a match voltage $V_M$ by, for example, switching on precharge switching transistors 910 and turning on all $EN_{ML}$ lines to turn on all ML switching transistors 226, 232; all SLs and SL #s are grounded; and all WLs are pulsed with a read voltage $V_R$. As discussed above, a "0" stored in an FeFET 322, 328 implies a low BL-to-SL or BL #-to-SL # resistance, and a "1" implies a high BL-to-SL or BL #-to-SL # resistance. For the input switching transistors 324, 330, a "1" at the corresponding IN or IN # turns the transistor on, and a "0" turns the transistor off. Because each FeFET 322, 328 is connected in series with a respective input switching transistor 324, 330, there would be a significant discharge through a serial combination only if both the FeFET 322, 328 connected to the BL or BL # and the respective input switching transistor 324, 330 are conducting, or low-resistance. Thus, there would be a significant discharge through a serial combination only if the value at the respective IN or IN # is a "1" and the respective FeFET 322, 328 stores a "0;" all other combinations results in no, or very low, discharge. As all serial combinations of FeFETs 322, 328 and respective input switching transistors 324, 330 in each row 312 branch off from the ML for the row, there would be a significant discharge from an ML only if the value at one of the INs or IN #s for the row is a "1" and the respective FeFET 322, 328 stores a "0."

Therefore, for a binary pair (IN, IN #) at the input and binary pair (DATA, DATA #) stored in the respective FeFETs 322, 328 in a TCAM cell 320, there would be a significant discharge from the corresponding ML if either IN=1 and DATA=0, or IN #=1 and DATA #=0, or both. That is, there would be significant discharge only if an input of (0, 1) is applied to a TCAM cell storing (1, 0), or an input of (1, 0) is applied to a TCAM cell storing (0, 1). If (0, 1) is defined as being indicative of a binary digit "0" and (1, 0) a binary digit "1," then there would be a significant discharge from an ML only if there is a no-match between an input binary digit and respective stored binary digit. There would be no significant discharge if the input binary digit matches the respective stored binary digit, i.e. an input of (0, 1) for a stored (0, 1), or an input of (1, 0) for a stored (1, 0).

Furthermore, if a (0, 0) for (IN, IN #) and (1, 1) for (DATA, DATA #) are defined as an "X" (don't-care), then there would be no significant discharge from the ML from a TCAM cell 320 if either the input binary digit or the stored binary digit is an "X." The matching scenarios are summarized in Table 1 below ("X" in Table 1 denotes a bit that can be either "0" or "1"):

TABLE 1

Input-Data Matching

| Input | Input# | Data | Data# | Match |
|---|---|---|---|---|
| 0 | 1 | 0 | 1 | No discharge (match) |
| 0 | 1 | 1 | 0 | Discharge (no match) |
| 1 | 0 | 0 | 1 | Discharge (no match) |
| 1 | 0 | 1 | 0 | No discharge (match) |
| 0 | 0 | X | X | No discharge (match) |
| X | X | 1 | 1 | No discharge (match) |

Thus, in some embodiments, the voltage on an ML would remain substantially $V_M$, indicating a match between the input and stored binary digital patterns if each binary digit in the input binary digital pattern and the corresponding binary digit in the stored binary digital pattern are identical to each other, or at least one of the two binary digits is an "X." The voltage on an ML would drop significantly due to the discharge if there is at least one mismatched binary digit between the input and stored binary digital patterns.

As a specific example, in FIG. 9, the TCAM array 310 is shown to store a set of values (1, 0), (0, 1), (1, 0), (0, 1), indicative of binary digital pattern "1010," in $Row_0$; (1, 0), (0, 1), (1, 0), (0, 1), indicative of binary digital pattern "1010," in $Row_1$, and (0, 1), (1, 0), (0, 1), (1, 0), indicative of binary digital pattern "0101," in $Row_{n-1}$. An input set of values (1, 0), (0, 1), (1, 0), (0, 1), indicative of binary digital pattern "1010," is applied at the IN and IN # lines in four columns 314. Because the input binary digital pattern is identical to those stored in $Row_0$ and $Row_1$, the MLs for both $Row_0$ and $Row_1$ remain substantially at $V_M$, or above a certain threshold voltage. Because the input binary digital pattern is not identical to the one stored in $Row_{n-1}$, and there is no don't-care bit in either binary digital pattern, the ML for $Row_{n-1}$ would fall significantly from $V_M$, or fall below the threshold voltage.

Figure 10:
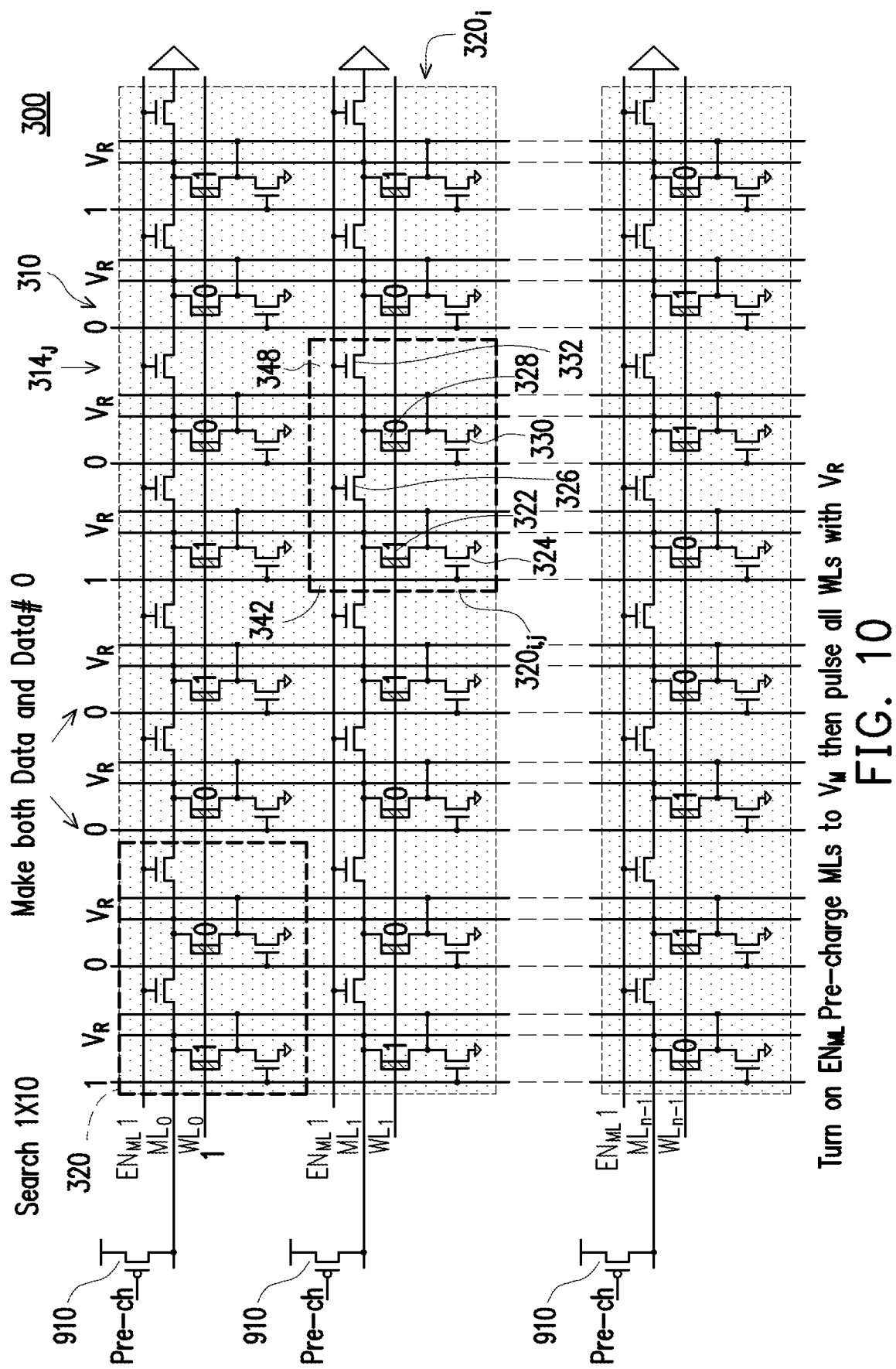
FIG. 10 illustrates a search operation, wherein a bit pattern containing a don't-care bit is searched against specific bit patterns, in accordance with some embodiments.

As another specific example, in FIG. 10, the TCAM array 310 is shown to store the same set of values as shown in FIG. 9. An input set of values (1, 0), (0, 0), (1, 0), (0, 1), indicative of binary digital pattern "1x10," is applied at the IN and IN # lines in four columns 314. Because the input binary digital pattern are identical to those stored in $Row_0$ and $Row_1$, except for the second most significant bit ("MSB"), and because the second MSB of the input binary digital pattern is a don't-care, the MLs for both $Row_0$ and $Row_1$ remains substantially at $V_M$, or above a certain threshold voltage, indicating a match. Because the input binary digital pattern is not identical to the one stored in $Row_{n-1}$, and at least one pair of corresponding digits (e.g., the MSB) in the input and stored binary digital patterns neither are identical to each other nor include an "X," the ML for $Row_{n-1}$ would fall significantly from $V_M$, or fall below the threshold voltage, indicating a no-match.

Figure 11:
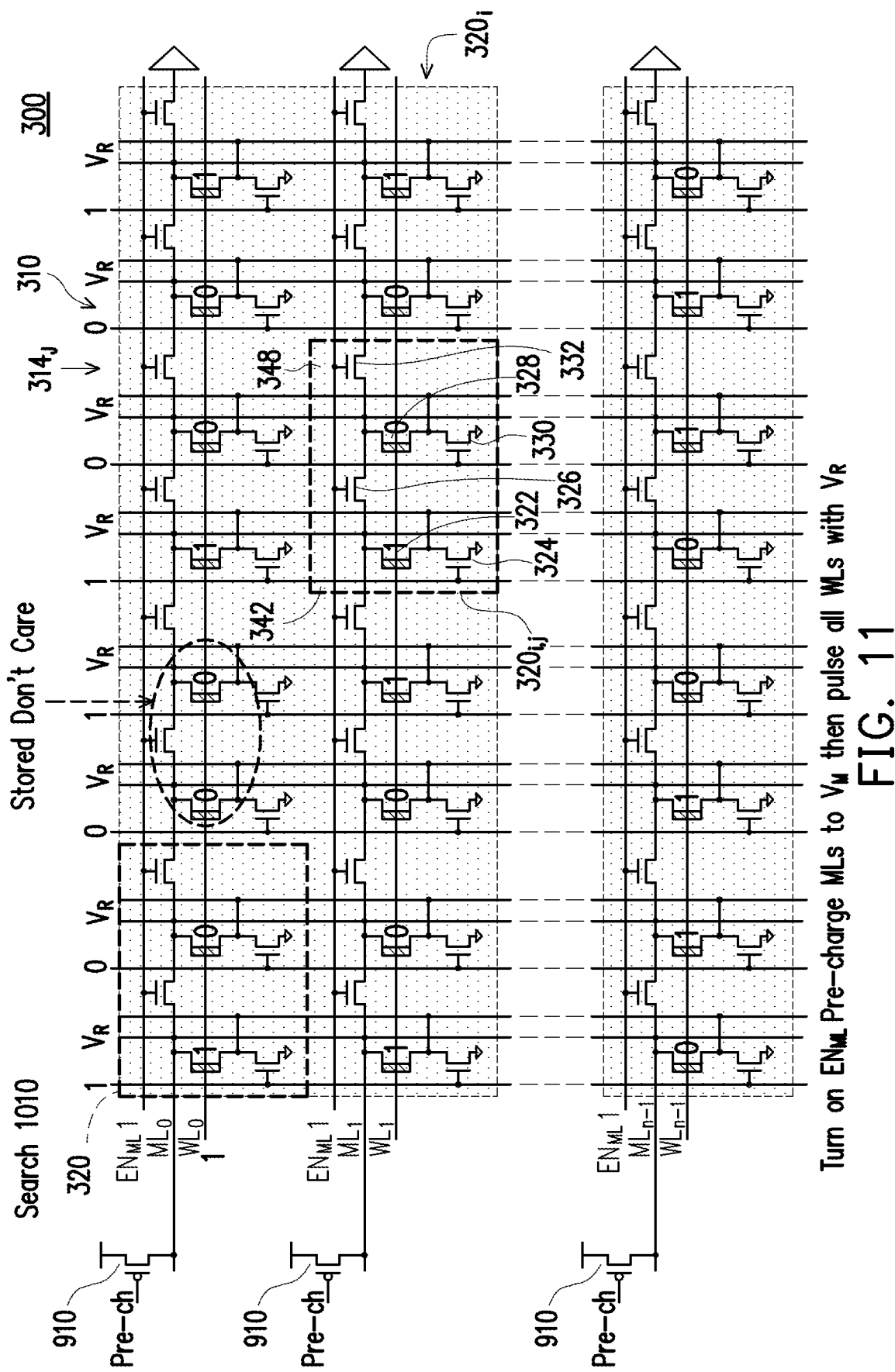
FIG. 11 illustrates a search operation, wherein a specific bit is searched against bit patterns, some of which contain don't-care bits, in accordance with some embodiments.

As another specific example, in FIG. 11, the TCAM array 310 is shown to store the same set of values as shown in FIG. 9, except that the second value stored in $Row_0$ is (1, 1), indicative of a binary digit of "X." That is, instead of a binary digit pattern of "1010," a "1x10" is stored in $Row_0$. An input set of values (1, 0), (0, 1), (1, 0), (0, 1), indicative of binary digital pattern "1010," is applied at the IN and IN # lines in four columns 314, as in FIG. 9. Because the input binary digital pattern are identical to the one stored in $Row_0$, except for the second most significant bit ("MSB"), and because the second MSB of the binary digital pattern stored in $Row_0$ is a don't-care, the ML for $Row_0$ remains substantially at $V_M$, or above a certain threshold voltage, indicating a match. Because the input binary digital pattern is identical to the one stored in $Row_1$, the ML for $Row_1$ remains substantially at $V_M$, or above the threshold voltage, indicating a match. Because the input binary digital pattern is not identical to the one stored in $Row_{n-1}$, and there is no don't-care bit in either binary digital pattern, the ML for $Row_{n-1}$ would fall significantly from $V_M$, or fall below the threshold voltage.

Figure 12:
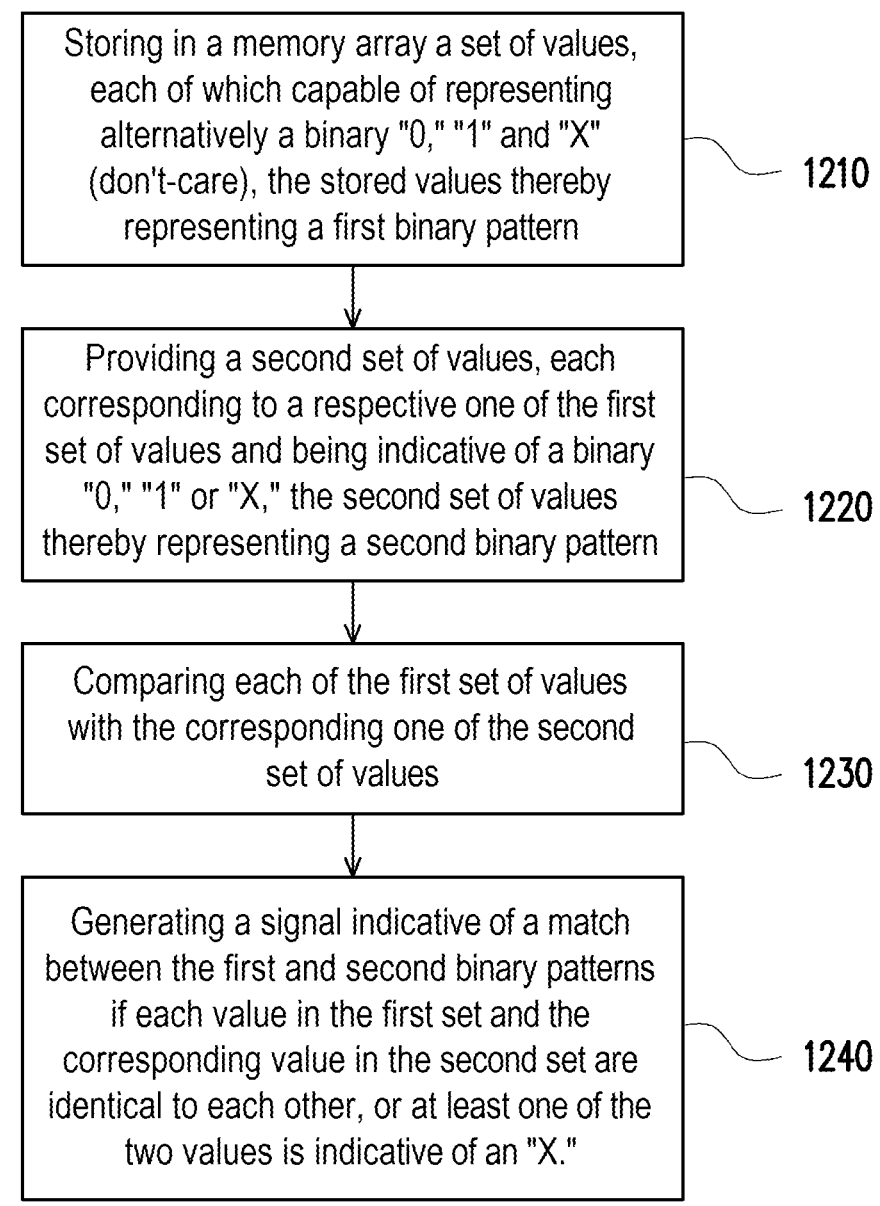
FIG. 12 outlines a process for data processing using content-addressable memory, in accordance with some embodiments.

In more general terms, in some embodiments, as outline in FIG. 12, a method of data processing 1200 includes storing 1210 in a memory array a set of values, each of which capable of representing alternatively a binary "0," "1" and "X" (don't-care), the stored values thereby representing a first binary pattern. The method further includes providing 1220 a second set of values, each corresponding to a respective one of the first set of values and being indicative of a binary "0," "1" or "X," the second set of values thereby representing a second binary pattern. The method further includes comparing 1230 each of the first set of values with the corresponding one of the second set of values, and generating 1240 a signal indicative of a match between the first and second binary patterns if each value in the first set and the corresponding value in the second set are identical to each other, or at least one of the two values is indicative of an "X."

The example embodiments described above provides an FeFET-based CAM that has an efficient structure and is capable of being used as both a conventional memory, with indexing read, and as a ternary content-addressable memory.

Furthermore, the embodiments permit don't-care values to be included in either the stored data or the input, allowing increased flexibility in application.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A memory device, comprising:
a first and second data storage units, each adapted to store one binary bit, each of data storage units including:
a matchline ("ML") switching transistor; and
a serial combination of a ferroelectric field-effect transistor ("FeFET") and an input switching transistor,
the ML switching transistors of the first and second data storage units being connected to each other at a junction, forming a serial combination having a first end and a second end,
one end of the serial combination of the FeFET and input switching transistor in the first data storage units being connected to the first end of the serial combination of the ML switching transistors at a junction, and one end of the serial combination of the FeFET and input switching transistor in the second data storage units being connected to the junction between the ML switching transistors.

2. The memory device of claim 1, wherein the FeFET in each of the first and second data storage units has a gate, a source and a drain, the drain of the FeFET in the first data storage unit being connected to the first end of the serial combination of the ML switching transistors, and the drain of the FeFET in the second data storage unit being connected to the junction between the ML switching transistors.

3. The memory device of claim 2, wherein each of the ML switching transistors and input switching transistors is a field-effect transistor ("FET") having a gate, a source and a drain,
the gates of the ML switching transistors in the first and second data storage units being connected to each other and being adapted to receive an matchline ("ML")-enable signal,
the gates of the FeFETs in the first and second data storage units being connected to each other and adapted to receive a wordling ("WL") signal, and
the gate of the input switching transistors are adapted to receive respective input signals.

4. The memory device of claim 1, further comprising: a third and four data storage units, each adapted to store one binary bit, each of data storage units including:
an ML switching transistor; and
a serial combination of an FeFET and an input switching transistor,
the ML switching transistors of the third and fourth data storage units being connected to each other at a junction, forming a serial combination having a first end and a second end, the first end being connected to the second end of the serial combination of the ML switching transistors of the first and second data storage units, the ML switching transistors of the first, second, third and fourth data storage units forming a matchline having an input end and an output end,
one end of the serial combination of the FeFET and input switching transistor in the third data storage units being connected to the first end of the serial combination of the ML switching transistors at a junction, and one end of the serial combination of the FeFET and input switching transistor in the fourth data storage units being connected to the junction between the ML switching transistors of the third and fourth data storage unit.

5. The memory device of claim 4, wherein each of the FeFETs, ML switching transistors and input switching transistors has a gate, a source and a drain, the memory device further comprising:
a WL connected to the gates of the FeFETs in the memory devices;
an ML-enable lines connected to the gates of the ML switching transistors;
a plurality of pairs of first and second bitlines ("BLs"), wherein the first bitline is connected to the first end of the serial combination of the ML switching transistors of the first and second data storage units, the second bitline is connected to the junction between the ML switching transistors of the first and second data storage units, the third bitline is connected to the first end of the serial combination of the ML switching transistors of the third and fourth data storage units, and the fourth bitline is connected to the junction between the ML switching transistors of the third and fourth data storage units;
a plurality of selectlines ("SLs"), each being connected to the junction between the FeFET and input switching transistor in a respective one of the data storage unit; and
a plurality of pairs of first and second inputlines ("INs"), each being connected to the gate of the input switching transistor in a respective one of the data storage unit.

6. The memory device of claim 4, wherein the drain each of the FeFET in each of the data storage units is connected to the ML switching transistor of the data storage unit.

7. The data processing device of claim 6, wherein, for each of the data storage units, the drain of the input switching transistor is connected to the source of the respective FeFET, and wherein the sources of the input switching transistors are adapted to be connected to a common voltage reference point.

8. The data processing device of claim 4, further comprising a switching device adapted to connect the input end of the matchline to a reference voltage.

9. A data processing device, comprising:
a plurality of wordlines ("WLs");
a plurality of matchline-enable ("ML-enable") lines;
a plurality of bitlines ("BLs");
a plurality of selectlines ("SLs");
a plurality of inputlines ("INs");
a plurality of data storage units arranged logically in a plurality of rows and a plurality of columns, each of the rows of data storage units associated with a respective one of the WLs and respective one of the ML-enable lines, each of the columns of the data storage units associated with a respective one of the BLs, a respective one of the SLs and a respective one of the INs, each of the data storage units comprising:
a matchline ("ML") switching transistor;
a ferroelectric field-effect transistor ("FeFET"); and an input switching transistor connected to the FeFET at a junction and forming a serial combination with the FeFET, the gate of the FeFET being connected to the associated WL; a first end of the serial combination being connected to the associated BL; the junction between the input switching transistor and FeFET being connected to the associated SL; the gate of the input switch transistor being connected to the associated IN;

the ML switching transistors in each row of the data storage devices are connected to each other in series at the plurality of BLs, forming a matchline having an input end and an output end, the gates of the ML switching transistors in each row of the data storage devices are connected to the associated ML-enable line.

10. The data processing device of claim 9, wherein the first end of the serial combination of the input switching transistor and FeFET in each of the plurality of data storage devices is the source or drain of the FeFET.

11. The data processing device of claim 9, further comprising:
a plurality of switching devices, each associated with a respective one of the matchlines, the plurality of switching devices being adapted to connect the input ends of the matchlines to a reference voltage; and
a match output interface adapted to receive signals from the output ends of the plurality of matchlines and generate an output signal indicative of the signals from the output ends of the matchlines.

12. The data processing device of claim 11, further comprising:
a search data input interface adapted to supply binary digital signals to the plurality of INs; and
a storage data input/output ("I/O") interface adapted to supply to the wordlines WL signals indicative to data to be stored in the data storage units, and to receive from the BLs signals indicative of the data stored in the data storage units.

13. The data processing device of claim 12, wherein: the storage data I/O interface is adapted to store in each pair of data storage units in a respective pair of columns a respective pair of binary digits of three different combinations, one indicative of a binary "0", one indicative of a binary "1", and one indicative of a binary don't-care ("X"), thereby storing in each row of data storage units a set of values indicative of a stored binary digital pattern in which each digit is "0", "1" or "X"; and
the search data input interface is adapted to supply to each pair of the INs associated with the respective pair of columns a respective pair of binary digits of three different combinations, one indicative of a binary "0", one indicative of a binary "1", and one indicative of a binary "X", thereby supplying to all rows of data storage units a set of values indicative of a input binary digital pattern in which each digit is "0", "1" or "X"; and
each of the MLs is adapted to supply at the output end a first signal indicative of a match between the stored binary digital pattern and the input binary digital pattern every digit in the input binary digital pattern and the respective digit in the stored binary digital pattern are identical to each other, or at least one of the two digits is an "X".

14. The data processing device of claim 13, wherein each of the set of stored values comprises a pair of binary numbers (b1, b2)=(0, 1), (1, 0) or (1, 1), wherein (0, 1) is indicative of a binary "0", (1, 0) a binary "1" and (1, 1) a binary "X".

15. The data processing device of claim 14, wherein each of the set of input values comprises a pair of binary numbers (a1, a2)=(0, 1), (1, 0) or (0, 0), wherein (0, 0) is indicative of a binary "X".

16. A data processing method, comprising:
storing in a memory array a first set of values, each of which capable of representing alternatively a binary "0", "1" and "X" (don't-care), the stored values thereby representing a first binary digital pattern;
providing a second set of values, each corresponding to a respective one of the first set of values and being indicative of a binary "0", "1" or "X", the second set of values thereby representing a second binary digital pattern;
comparing each of the first set of values with the corresponding one of the second set of values; and
generating a signal indicative of a match between the first and second binary patterns if each value in the first set and the corresponding value in the second set are identical to each other, or at least one of the two values is indicative of an "X"; wherein storing a the first set values comprises storing a set of binary value pairs, wherein storing each of the binary value pair comprises writing the binary value pair to respective pairs of first and second data storage units in a memory device, each of data storage units including:
a matchline ("ML") switching transistor; and
a serial combination of a ferroelectric field-effect transistor ("FeFET") and an input switching transistor, each of the ML switching transistor, FeFET and input switching transistor having a gate, a source and a drain, and the FeFET having a threshold voltage for altering its memory state,
the ML switching transistors of the first and second data storage units being connected to each other at a junction, forming a serial combination having a first end and a second end,
one end of the serial combination of the FeFET and input switching transistor in the first data storage units being connected to the first end of the serial combination of the ML switching transistors at a junction, and one end of the serial combination of the FeFET and input switching transistor in the second data storage units being connected to the junction between the ML switching transistors.

17. The data processing method of claim 16,
wherein writing each bit of the binary value pair to the respective one of the data storage units includes:
turning off both the ML switching transistor and input switching transistor; and
applying between the gate and the source and drain of the FeFET a voltage of a magnitude greater that the threshold voltage.

18. The data processing method of claim 16, wherein:
the comparing step comprises applying an input voltage indicative of the value of bit to the gate of the respective input switching transistor; and
the generating step comprises summing currents in the serial combinations of FeFETs and input switching transistors in the set of pairs of data storage units.

19. The data processing method of claim 16, wherein the storing step comprises storing a plurality of sets of values, each set in a respective row of data storage units in a memory array comprising data storage units logically arranged in rows and columns, wherein the storing a plurality of sets of values comprises:

simultaneously writing all "0"s of the binary values to a column of data storage units during a first time period; and simultaneously writing all "1"s of the binary values to the column of data storage units during a second time period different from the first time period.

20. The data processing method of claim 16, further comprising reading the first set of values from the data storage units.

\* \* \* \* \*

UNITED STATES PATENT AND TRADEMARK OFFICE
CERTIFICATE OF CORRECTION

PATENT NO. : 11,232,838 B2  
APPLICATION NO. : 17/102762  
DATED : January 25, 2022  
INVENTOR(S) : Shih-Lien Linus Lu Page 1 of 1

It is certified that error appears in the above-identified patent and that said Letters Patent is hereby corrected as shown below:

On the Title Page

Page 2, Column 1, item [56], Line 1, delete "bencmarking" and insert -- benchmarking --.

In the Specification

Column 10, Line 12, delete ""1×10,"" and insert -- "1X10," --.

Column 10, Line 30, delete "1×10" and insert -- "1X10" --.

In the Claims

Column 11, Line 53, Claim 3, delete "wordling" and insert -- wordline --.

Column 14, Line 24, Claim 16, delete "a the" and insert -- the --.

Signed and Sealed this  
Twenty-second Day of March, 2022

Drew Hirshfeld  
*Performing the Functions and Duties of the*  
*Under Secretary of Commerce for Intellectual Property and*  
*Director of the United States Patent and Trademark Office*